United States Patent
Bhat et al.

(10) Patent No.: US 10,054,652 B2
(45) Date of Patent: Aug. 21, 2018

(54) METHOD AND MAGNETIC RESONANCE IMAGING APPARATUS FOR SPATIAL FAT SUPPRESSION IN MULTI-CONTRAST SMS IMAGING

(71) Applicant: Siemens Healthcare GmbH, Erlangen (DE)

(72) Inventors: Himanshu Bhat, Newton, MA (US); Mario Zeller, Erlangen (DE)

(73) Assignee: Siemens Healthcare GmbH, Erlangen (DE)

(*) Notice: Subject to any disclaimer, the term of this patent is extended or adjusted under 35 U.S.C. 154(b) by 170 days.

(21) Appl. No.: 15/262,464

(22) Filed: Sep. 12, 2016

(65) Prior Publication Data

US 2018/0074146 A1 Mar. 15, 2018

(51) Int. Cl.
*G01V 3/00* (2006.01)
*G01R 33/48* (2006.01)
*G01R 33/483* (2006.01)
*G01R 33/561* (2006.01)

(52) U.S. Cl.
CPC ..... *G01R 33/4828* (2013.01); *G01R 33/4835* (2013.01); *G01R 33/5617* (2013.01)

(58) Field of Classification Search
CPC .................................................. G01R 33/4835
USPC ................................ 324/307, 309, 314, 306
See application file for complete search history.

(56) References Cited

U.S. PATENT DOCUMENTS

2017/0146625 A1* 5/2017 Beck ................... G01R 33/4828
2017/0146631 A1* 5/2017 Beck ................... G01R 33/4833
2018/0024214 A1* 1/2018 Bhat ................... G01R 33/4828
324/309

OTHER PUBLICATIONS

Setsompop et al., "Blipped-Controlled Aliasing in Parallel Imaging for Simultaneous Multislice Echo Planar Imaging With Reduced g-Factor Penalty," Magnetic Resonance in Medicine, vol. 67, pp. 1210-1224 (2012).
Setsompop et al., "Improving Diffusion MRI Using Simultaneous Multi-Slice Echo Planar Imaging," NeuroImage, vol. 63, pp. 569-580 (2012).
Cauley et al., "Interstice Leakage Artifact Reduction Technique for Simultaneous Multislice Acquisitions," Magnetic Resonance in Medicine, vol. 72, pp. 93-102 (2014).

* cited by examiner

Primary Examiner — Louis Arana
(74) Attorney, Agent, or Firm — Schiff Hardin LLP

(57) ABSTRACT

In a method and imaging apparatus for acquiring multi-contrast magnetic resonance (MR) data, a data acquisition scanner is operated in a simultaneous multislice data acquisition sequence to radiate at least one single-band binomial radio-frequency (RF) pulse, that excites fat protons in at least some slices of an examination subject from which MR raw data are to be acquired simultaneously, and leaving water in a longitudinal plane for those at least some slices, and leaving all spin species in a longitudinal plane in others of the slices that are to be acquired simultaneously. A spoiler gradient is subsequently activated that dephases the fat protons that were excited. The scanner is then operated to execute an MR data acquisition sequence with excitation by radiation of multi-band RF pulses. MR raw data resulting from excitation of the fat protons, and MR raw data acquired with said multi-band RF excitation, are compiled in respective data files.

6 Claims, 5 Drawing Sheets

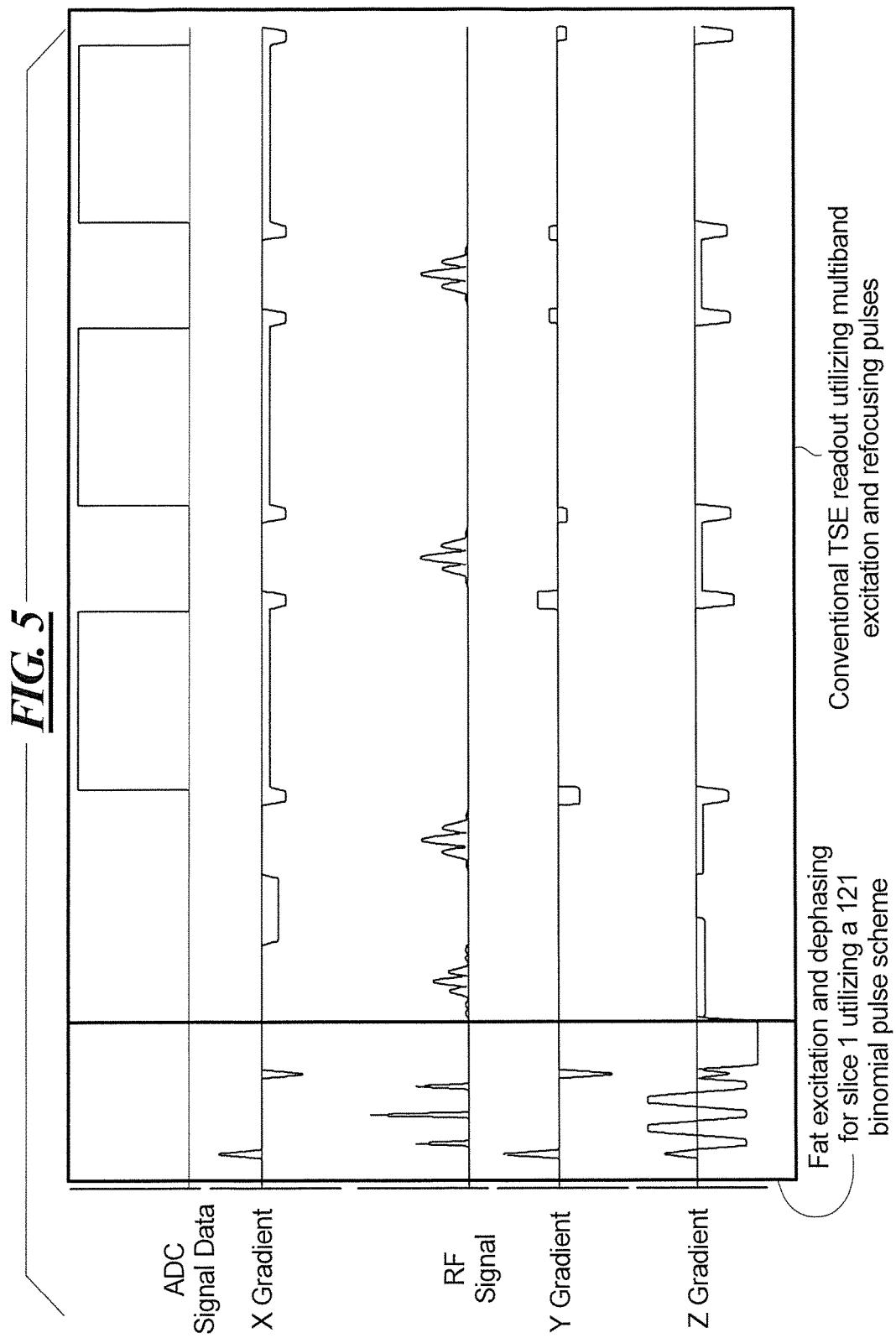

METHOD AND MAGNETIC RESONANCE IMAGING APPARATUS FOR SPATIAL FAT SUPPRESSION IN MULTI-CONTRAST SMS IMAGING

BACKGROUND OF THE INVENTION

Field of the Invention

The present invention concerns the field of magnetic resonance imaging, and in particular to acquiring magnetic resonance raw data, to be converted into image data, by a simultaneous multi-slice technique.

Description of the Prior Art

MR imaging is a widely used imaging modality for medical diagnosis as well as for material inspection.

In a magnetic resonance apparatus, the examination object (a patient, in the case of medical magnetic resonance imaging) is exposed to a strong and constant basic magnetic field, by the operation of a basic field magnet of an MR scanner, in which the examination object is situated. The MR scanner also has a gradient coil arrangement that is operated in order to activate gradient fields that spatially encode the magnetic resonance signals. The magnetic resonance signals are produced by the radiation of radio-frequency (RF) pulses from an RF radiator, such as one or more antennas, in the MR scanner. These RF pulses excite nuclear spins in the examination object, and are therefore often called excitation pulses. The excitation of the nuclear spins at an appropriate frequency gives the excited spins a magnetization that causes the nuclear spins to deviate, by an amount called the flip angle, from the alignment of the nuclear spins that was produced by the basic magnetic field. As the nuclear spins relax, while returning to alignment in the basic magnetic field, they emit MR signals (which are also RF signals), which are received by suitable RF reception antennas in the MR scanner, which may be the same or different from the RF radiator used to emit the excitation pulse.

The emitted MR signals have a signal intensity that is dependent on the exponential decay over time of the magnetization of the nuclear spins. The acquired signals are digitized so as to form raw data, which are entered into a memory that is organized as k-space, as k-space data. Many techniques are known for reconstructing an image of the examination object from the k-space data.

By appropriately selecting different characteristics of the MR data acquisition sequence that is used, the acquired signals can be differently weighted so that different sources of the detected MR signals (i.e., different tissues in the case of medical MR imaging) appear with different contrasts in the reconstructed image. In the case of medical MR imaging, a weighting is selected that causes the tissue that is important for making the intended medical diagnosis to have the best contrast (brightness) in the reconstructed image. One such type of weighting is known as T1-weighting, because it depends on the so-called T1 relaxation time of the nuclear spins.

Many different techniques are known for acquiring the raw MR data. One such technique is known as simultaneous multi-slice (SMS) acquisition, which is a technique for accelerating the acquisition of the data from a given volume of the examination object, wherein nuclear spins in multiple slices are excited simultaneously, and the resulting MR signals are simultaneously acquired from each slice. This results in a dataset in k-space that is composed of data from the multiple slices collapsed on top of each other. Techniques are known for separating or uncollapsing the data for these respective slices during image reconstruction, such as the slice GRAPPA (Generalized Autocalibration Partially Parallel Acquisitions) technique, which is schematically illustrated in FIG. 1. In the example shown in FIG. 1, multiple slices S1, S2 and S3 are excited simultaneously, resulting in each slice generating an echo train of magnetic resonance signals, which are acquired according to the known blipped CAIPIRINHA (Controlled Aliasing in Parallel Imaging Results in Higher Acceleration) technique. Details of such techniques are described, for example, in Setsompop et al., "Blipped-Controlled Aliasing in Parallel Imaging for Simultaneous Multislice Echo Planar Imaging With Reduced g-Factor Penalty," Magnetic Resonance in Medicine, Vol. 67, pp. 1210-1224 (2012) and Setsompop et al., "Improving Diffusion MRI Using Simultaneous Multi-Slice Echo Planar Imaging," NeuroImage, Vol. 63, pp. 569-580 (2012) and Cauley et al., "Interslice Leakage Artifact Reduction Technique for Simultaneous Multislice Acquisitions," Magnetic Resonance in Medicine, Vol. 72, pp. 93-102 (2014).

Excitation of the nuclear spins in the simultaneously acquired slices is implemented with a multi-band (MB) RF pulse. An MB RF pulse is generated by the superimposition of a number of individual single band (SB) RF pulses, of the type that are typically used to excite nuclear spins in a single selected slice in conventional magnetic resonance imaging.

The turbo spin echo (TSE) sequence is the "clinical workhorse" sequence for MR imaging, by virtue of being the most utilized sequence for all types of body region imaging. A TSE sequence has several echo trains, and in each echo train, multiple phase encoding lines of the entirety of k-space are scanned (filled with data) after one excitation pulse. This is achieved by refocusing the spins after each readout line, utilizing refocusing RF pulses. Compared to a conventional spin echo (SE) sequence, the acquisition time in a TSE sequence is reduced by the number of refocused echoes in one echo train. This reduction is known as the turbo factor.

A conventional TSE sequence is illustrated in FIG. 2, with the example of sixteen echoes.

It is known to combine SMS and TSE, in order to acquire data from two or more slices simultaneously. This reduces the minimum repetition time (TR) which is given by the length of all echo trains for all slices that are executed back-to-back. The reduction occurs because fewer slices must be acquired with such a combination. The total number of reduced slices is known as the slice acceleration factor. For many examinations, however, the minimum TR is not limited by the total time of all echo trains, but instead is limited by the desired image contrast.

For example, for T2-weighted imaging, a long TR is necessary to allow for T1 relaxation to provide the desired T2 contrast. This means that if the TR is five seconds without SMS, an SMS factor of 2 would allow a TR reduction to 2.5 seconds, but this reduction cannot be achieved without changing the image contrast to a level that is not clinically acceptable.

The echo trains for two adjacent slices in TSE imaging are often produced in two concatenations, such as to prevent slice-crosstalk effects. With SMS it would be theoretically possible to reduce the number of concatenations, but in practice this would again lead to slice-crosstalk.

In order to provide adequate diagnostics, it is often necessary to acquire the identical slice stack of a subject with two different TSE contrasts. One example is a T2-weighted TSE and a T2-weighted TSE with CSF attenuation for the brain (known as a FLAIR sequence). Another example is a T1, proton density (PD) or T2-weighted TSE with and without fat saturation (fs) for joint imaging, known as T1/T1 fs, PD/PD fs or T2/T2 fs.

In these types of known sequence combinations, each sequence (T1 and T1 fs TSE) must be executed separately by the data acquisition scanner. Because of the aforementioned limitations, no considerable acceleration in the data acquisition can be achieved with SMS in such a combination.

SUMMARY OF THE INVENTION

An object of the present invention is to provide a magnetic resonance imaging method and apparatus in order to produce a fat saturated image of an examination subject and a conventional image of the examination subject simultaneously.

This object is achieved in accordance with the present invention by a method and magnetic resonance imaging apparatus wherein one or more single-band binomial pulses are emitted in an SMS data acquisition technique, the single band binomial pulses exciting fat in some of the slices from which data are to be acquired simultaneously, but leave water in the longitudinal plane for another portion of the slices that are to be acquired simultaneously. Subsequently, spoiler gradients are activated in order to instantaneously again dephase the fat protons that were excited. Thereafter, any desired pulse sequence for magnetic resonance data acquisition can be executed in a conventional multi-band imaging scan.

The binomial fat excitation pulse (or pulses) combined with spoiler gradients achieve a spatial fat suppression in multi-contrast SMS imaging. Multiple contrasts can be obtained in one scan, independently of the SMS sequence that is employed. The method according to the invention, moreover, requires lower peak power of the radiated RF energy than is the case in other SMS multi-contrast sequences.

BRIEF DESCRIPTION OF THE DRAWINGS

FIG. 5 shows the combination of a fat suppression module and subsequent spoiler gradients with an SMS TSE sequence in accordance with the present invention.

DESCRIPTION OF THE PREFERRED EMBODIMENTS

Figure 3:
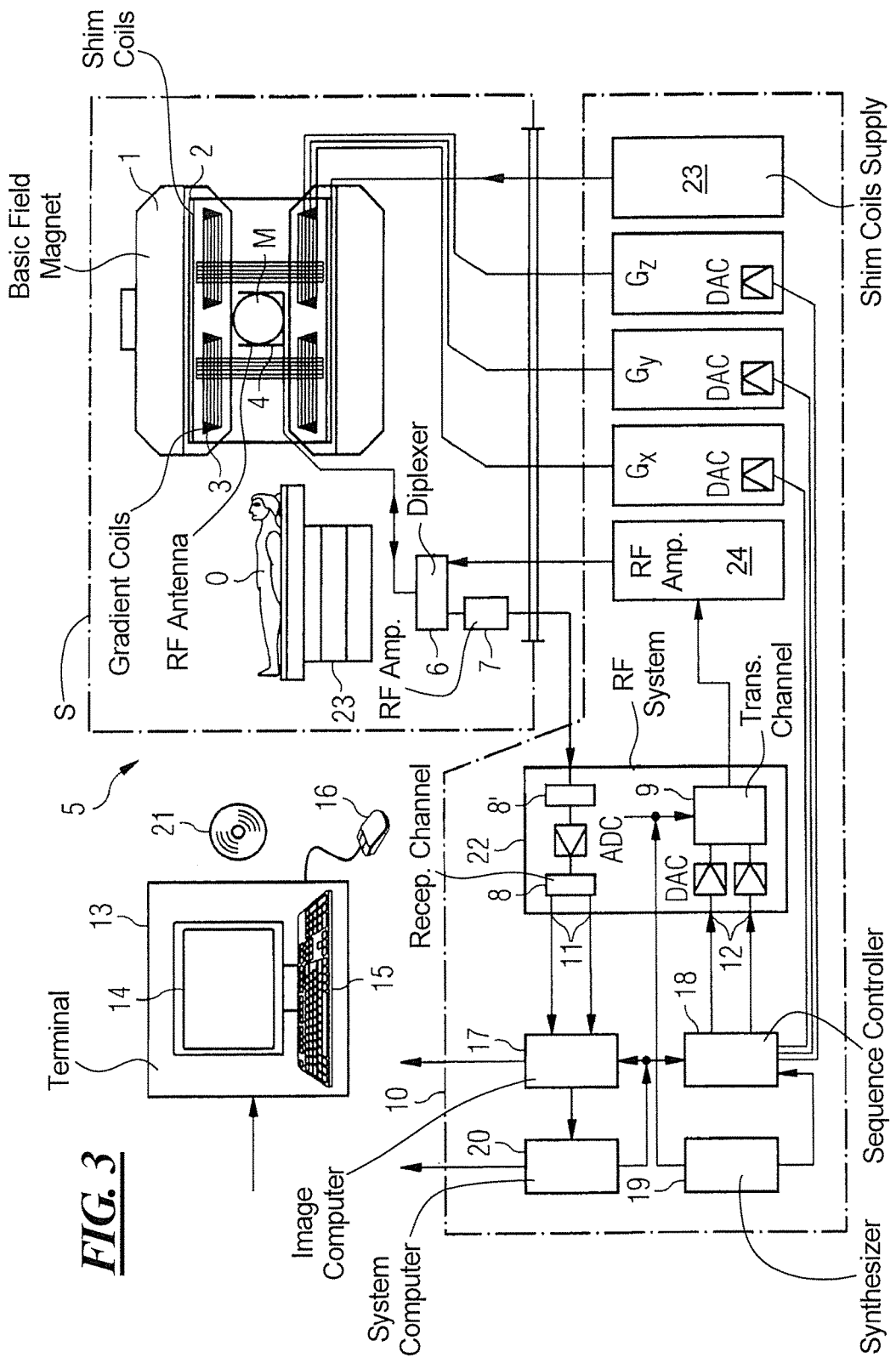
FIG. 3 schematically illustrates a magnetic resonance imaging apparatus constructed and operating in accordance with the present invention.

FIG. 3 schematically illustrates a magnetic resonance apparatus 5 (a magnetic resonance imaging or tomography device). A basic field magnet 1 generates, a temporally constant strong magnetic field for the polarization or alignment of the nuclear spin in a region of an examination subject O, such as a portion of a human body that is to be examined, lying on a table 23 in order to be moved into the magnetic resonance apparatus 5. The high degree of homogeneity in the basic magnetic field necessary for the magnetic resonance measurement (data acquisition) is defined in a typically sphere-shaped measurement volume M, in which the portion of the human body that is to be examined is placed. In order to support the homogeneity requirements temporally constant effects are eliminated by shim-plates made of ferromagnetic materials are placed at appropriate positions. Temporally variable effects are eliminated by shim-coils 2 and an appropriate control unit 23 for the shim-coils 2.

A cylindrically shaped gradient coil system 3 is incorporated in the basic field magnet 1, composed of three windings. Each winding is supplied by a corresponding amplifier Gx, Gy and Gz, with power for generating a linear gradient field in a respective axis of a Cartesian coordinate system. The first partial winding of the gradient field system 3 generates a gradient Gx in the x-axis, the second partial winding generates a gradient Gy in the y-axis, and the third partial winding generates a gradient Gz in the z-axis. Each amplifier 24-26 has a digital-analog converter (DAC), controlled by a sequencer 18 for the accurately-times generation of gradient pulses.

A radio-frequency antenna 4 is located within the gradient field system 3, which converts the radio-frequency pulses provided by a radio-frequency power amplifier 24 into a magnetic alternating field for the excitation of the nuclei by tipping ("flipping") the spins in the subject or the region thereof to be examined, from the alignment produced by the basic magnetic field. The radio-frequency antenna 4 is composed of one or more RF transmitting coils and one or more RF receiving coils in the form of an annular, linear or matrix type configuration of coils. The alternating field based on the precessing nuclear spin, i.e. the nuclear spin echo signal normally produced from a pulse sequence composed of one or more radio-frequency pulses and one or more gradient pulses, is also converted by the RF receiving coils of the radio-frequency antenna 4 into a voltage (measurement signal), which is transmitted to a radio-frequency system 22 via an amplifier 7 of a radio-frequency receiver channel 8, 8'. The radio-frequency system 22 furthermore has a transmitting channel 9, in which the radio-frequency pulses for the excitation of the magnetic nuclear resonance are generated. For this purpose, the respective radio-frequency pulses are digitally depicted in the sequencer 18 as a series of complex numbers, based on a given pulse sequence provided by the system computer 20. This number series is sent via an input 12, in each case, as real and imaginary number components to a digital-analog converter (DAC) in the radio-frequency system 22 and from there to the transmitting channel 9. The pulse sequences are modulated in the transmitting channel 9 to a radio-frequency carrier signal, the base frequency of which corresponds to the resonance frequency of the nuclear spin in the measurement volume. The modulated pulse sequences of the RF transmitter coil are transmitted to the radio-frequency antenna 4 via an amplifier 28.

Switching from transmitting to receiving operation occurs via a transmission-receiving switch 6. The RF transmitting coil of the radio-frequency antenna 4 radiates the radio-frequency pulse for the excitation of the nuclear spin in the measurement volume M and scans the resulting echo signals via the RF receiving coils. The corresponding magnetic resonance signals obtained thereby are demodulated to an intermediate frequency in a phase sensitive manner in a first demodulator 8' of the receiving channel of the radio-frequency system 22, and digitalized in an analog-digital converter (ADC). This signal is then demodulated to the base frequency. The demodulation to the base frequency and the separation into real and imaginary parts occurs after digitization in the spatial domain in a second demodulator 8, which emits the demodulated data via outputs 11 to an image processor 17. In an image processor 17, an MR image is reconstructed from the measurement data obtained in this manner through the use of the method according to the invention, which includes computation of at least one disturbance matrix and the inversion thereof, in the image processor 17. The management of the measurement data, the image data, and the control program occurs via the system computer 20. The sequencer 18 controls the generation of the desired pulse sequences and the corresponding scanning of k-space with control programs, in particular, in accordance with the method according to the invention. The sequencer 18 controls accurately-timed switching (activation) of the gradients, the transmission of the radio-frequency pulse with a defined phase amplitude, and the reception of the magnetic resonance signals. The time base for the radio-frequency system 22 and the sequencer 18 is provided by a synthesizer 19. The selection of appropriate control programs for the generation of an MR image, which are stored, for example, on a DVD 21, as well as other user inputs such as a desired number n of adjacent clusters, which are to collectively cover the desired k-space, and the display of the generated MR images, occurs via a terminal 13, which includes units for enabling input entries, such as, e.g. a keyboard 15, and/or a mouse 16, and a unit for enabling a display, such as, e.g. a display screen.

The components within the dot-dash outline S are commonly called a magnetic resonance scanner.

In the data acquisition method and apparatus in accordance with the invention, raw data representing a fat saturated image are acquired simultaneously with raw data representing a conventional image. Appropriate image reconstruction algorithms are used to generate the fat saturated image and the conventional image from the acquired data, respectively.

The basis of the invention is to utilize one or more single-band binomial pulses, which excite fat in at least one of the slices to be acquired simultaneously, but leave fat in the longitudinal plane in at least one other of the slices to be acquired simultaneously. More specifically, in the case of two slices S1 and S2, fat is excited and water is left in the longitudinal plane in Si and fat and water are both left in the longitudinal plane in S2, since the single-band binomial pulse targets only 51. Spoiler gradients are subsequently activated in order to instantaneously again dephase the fat protons that were excited. Thereafter, any desired pulse sequence can be executed in a conventional multi-band imaging scan.

Figure 4:
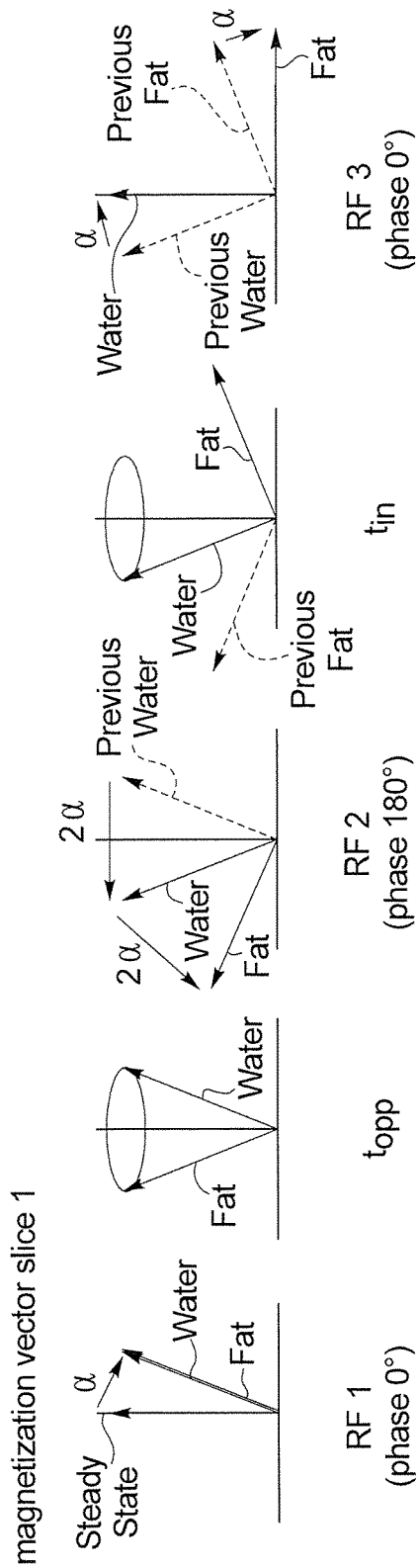
FIG. 4 shows the evolution of the magnetization vectors of fat and water in accordance with the present invention.

FIG. 4 shows the evolution of magnetization vectors of fat and water for a 1(-2)1 binomial pulse, as one example of many possible binomial pulse schemes for fat excitation that can be used in accordance with the invention.

Figure 1:
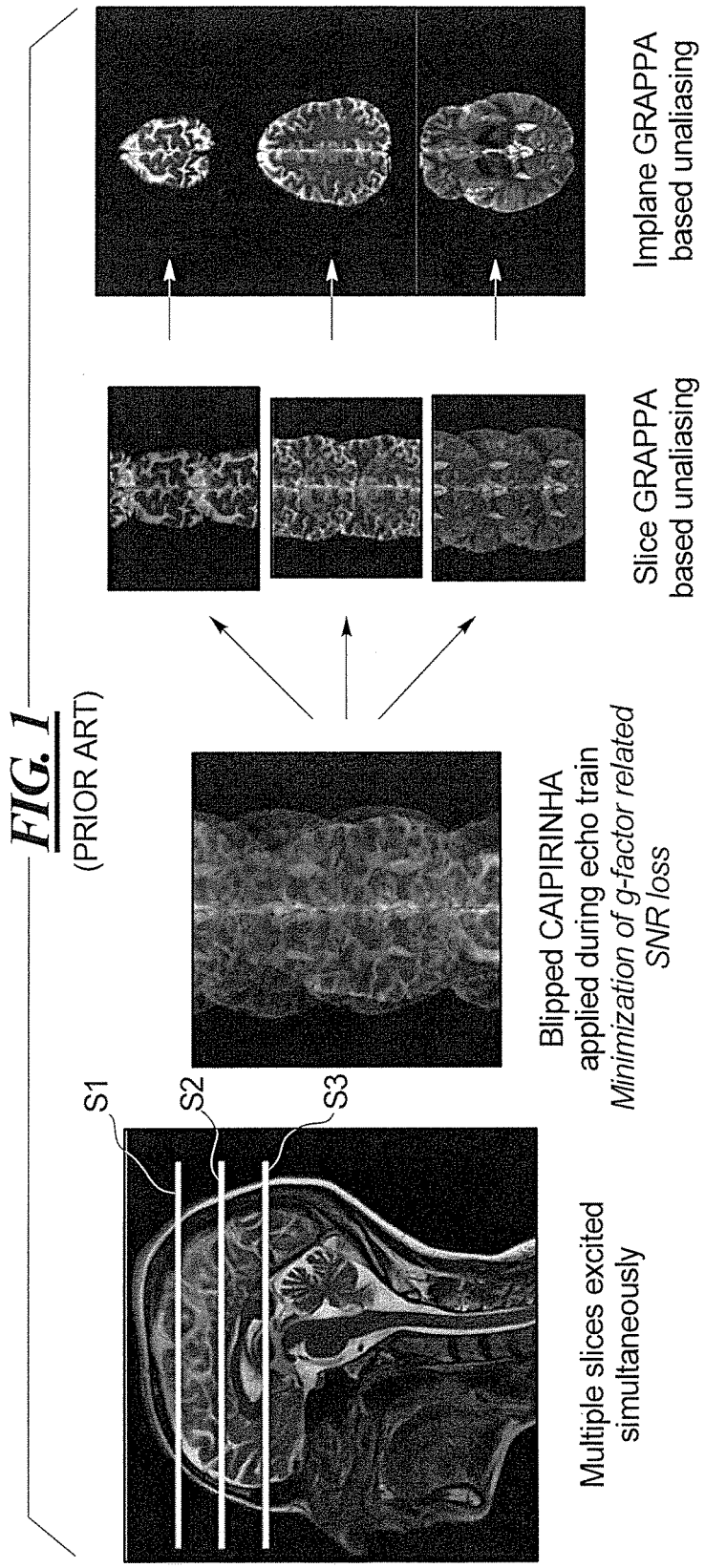
FIG. 1, as noted above, schematically illustrates a conventional SMS acceleration technique.
Figure 2:
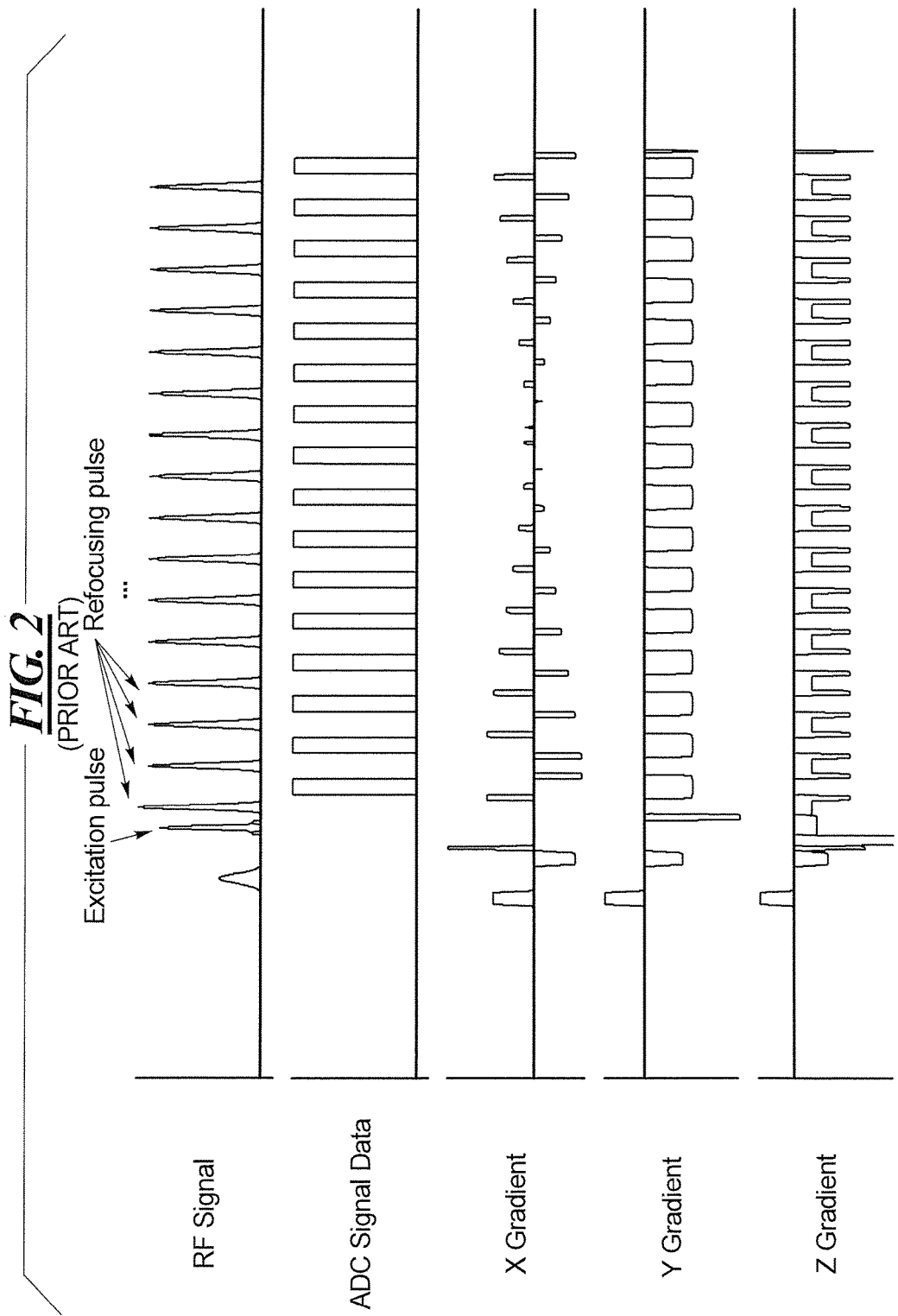
FIG. 2, as noted above, schematically illustrates a conventional TSE sequence, with the example of sixteen echoes.

As shown in FIG. 1, both fat and water vectors are initially in a steady state, at which time an initial radio-frequency (RF) pulse (RF 1) is radiated, that tilts both the fat and water magnetization by an angle α, which may be, for example, 22.5°. Both fat and water magnetization vectors have an equal phase after RF 1.

After a waiting time $t_{opp}$, the water and fat vectors are out of phase. Then another RF pulse (RF 2) is radiated that tilts the magnetization by 2α. RF 2 has a phase of 180°. After another waiting period $2 \cdot t_{opp} = t_{in}$, the water magnetization vector is moved back to the longitudinal axis (vertical axis in FIG. 4) by another RF pulse (RF 3), while the fat vector is completely in the transverse plane (horizontal axis in FIG. 4). RF 2 is radiated at $t_{opp}$ and RF 3 is radiated $t_{in}$.

FIG. 5 shows the combination of a fat suppression module in the form of the 1(-2)1 pulse scheme shown in FIG. 4, and the activation of subsequent spoiler gradients in accordance with the invention, followed by an SMS TSE sequence that includes a multi-band 90° pulse, several multi-band 180° pulses, and multiple signal readouts.

In the method according to the invention, raw data from the complete stack of slices must be acquired twice (i.e., in two executions). During the second execution (scan), the fat suppression module targets the slices that were left out in the first execution.

In co-pending U.S. Provisional Application Control No. 62/241,849, filed on Oct. 15, 2015, an SMS technique is disclosed wherein an inversion pulse is used that targets only one of the simultaneously excited slices. In the second repetition, the slice targeted by this inversion pulse is changed. That approach was demonstrated for T2/T2-FLAIR imaging in the brain. This approach is limited to spatial saturation methods, and requires a very sharp inversion pulse profile in order to prevent slice crosstalk.

Co-pending Non-Provisional application Ser. No. 15/218,388, filed Jul. 25, 2016 discloses an SMS approach to simultaneously acquire certain contrast with and without fat saturation. A joint binomial pulse is used therein, which excites only water in one slice and fat and water simultaneously in the other slice. This technique may be limited by the available RF peak power.

The technique disclosed herein may be combined with the methods described in these two co-pending applications. The content of both of those co-pending applications is incorporated herein by reference. The complete stack of slices must be acquired twice, as noted above. During the second run, the fat suppression module targets the slices that were left out in the first run.

The fat saturation preparation module is independent from the remainder of the sequence, and therefore the present method is not limited to the use of an SMS TSE sequence for the imaging section of the pulse sequence. Any suitable SMS sequence (such as SMS echo planar imaging of SMS spin echo or gradient echo imaging) can be used. The module can be executed more than once in the readout.

If a weak fat suppression effect is desired (which is often the case for MSK applications), the flip angles can be chosen to be smaller. Moreover, other parameters such as pulse spacing, pulse phase and the initial phase can be varied as well, in order to achieve a different image contrast, such as water saturation instead of fat saturation, or silicone saturation, or a mixed contrast.

The method can be used to acquire data from more than two slices simultaneously. For example, fat suppression can occur in slices 1 and 2 by utilizing a multi-banded fat suppression module, and no suppression in a third slice (slice 3).

When combining the method described herein with the method described in the aforementioned provisional application, for example, an inversion pulse can be used to suppress a certain tissue type, such as CSF, in one slice, and the fat suppression module described herein can be used to suppress fat in another slice. If the method disclosed herein is combined with the procedure described in the aforementioned non-provisional application, for example, different binomial pulse schemes can be used to suppress two different materials in two slices, such as fat and silicone, respectively.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for acquiring multi-contrast magnetic resonance data, comprising:
    operating a magnetic resonance data acquisition scanner to radiate at least one single-band binomial radio-frequency pulse in a simultaneous multislice data acquisition sequence, said at least one single-band binomial pulse exciting fat protons in at least some slices of an examination subject from which magnetic resonance raw data are to be acquired simultaneously, and leaving water in a longitudinal plane in said slices and leaving water and fat in the longitudinal plane in others of said slices that are to be acquired simultaneously;
    subsequently operating said magnetic resonance data acquisition scanner by activating a spoiler gradient that dephases said fat protons that were excited;
    subsequently operating said magnetic resonance data acquisition scanner to execute a magnetic resonance data acquisition pulse sequence with multi-band excitation comprising radiation of multi-band radio-frequency pulses; and
    compiling magnetic resonance raw data resulting from excitation of said fat protons in said at least some of said slices that were dephased, and magnetic resonance raw data from said others of said slices without fat suppression acquired with said multi-band radio-frequency excitation, in respective data files, and making said respective data files available in electronic form for further processing.

2. A method as claimed in claim 1 comprising providing said data files to a reconstruction computer and, in said reconstruction computer, generating a fat-saturated magnetic resonance image from said magnetic resonance data resulting from excitation of said fat protons, and generating a different image from said magnetic resonance raw data acquired from said multi-band excitation.

3. A method as claimed in claim 1 comprising operating said magnetic resonance data acquisition scanner to execute a TSE sequence, as said sequence with multi-band excitation.

4. A magnetic resonance apparatus comprising:
    a magnetic resonance data acquisition scanner;
    a control computer configured to operate said magnetic resonance data acquisition scanner to radiate at least one single-band binomial radio-frequency pulse in a simultaneous multislice data acquisition sequence, said at least one single-band binomial pulse exciting fat protons in at least some slices of an examination subject from which magnetic resonance raw data are to be acquired simultaneously, and leaving water in a longitudinal plane in said slices and leaving water and fat in the longitudinal plane in others of said slices that are to be acquired simultaneously;
    said control computer being configured to subsequently activate a spoiler gradient in said magnetic resonance data acquisition scanner that dephases said fat protons that were excited;
    said control computer being configured to subsequently operate said magnetic resonance data acquisition scanner to execute a magnetic resonance data acquisition pulse sequence with multiband excitation comprising radiation of multi-band radio-frequency pulses; and
    said control computer being configured to compile magnetic resonance raw data resulting from excitation of said fat protons in said at least some of said slices that were dephased, and magnetic resonance raw data from said others of said slices without fat suppression acquired with said multi-band radio-frequency excitation, in respective data files, and making said respective data files available in electronic form for further processing.

5. A magnetic resonance apparatus as claimed in claim 4 comprising a reconstruction computer provided with said data files, said reconstruction computer being configured to generate a fat-saturated magnetic resonance image from said magnetic resonance data resulting from excitation of said fat protons, and generating a different image from said magnetic resonance raw data acquired from said multi-band excitation.

6. A magnetic resonance apparatus as claimed in claim 4 wherein said control computer is configured to operate said magnetic resonance data acquisition scanner to execute a TSE sequence, as said sequence with multi-band excitation.

* * * * *